(12) United States Patent
Yaegashi et al.

(10) Patent No.: US 6,615,590 B1
(45) Date of Patent: Sep. 9, 2003

(54) HEAT EXCHANGER FOR TEMPERATURE CONTROL

(75) Inventors: Shigesuke Yaegashi, Ibaraki (JP); Hiroyuki Sakama, Ibaraki (JP)

(73) Assignee: SMC Corporation, Tokyo (JP)

( * ) Notice: Subject to any disclaimer, the term of this patent is extended or adjusted under 35 U.S.C. 154(b) by 0 days.

(21) Appl. No.: 09/713,195

(22) Filed: Nov. 16, 2000

(30) Foreign Application Priority Data

Dec. 16, 1999 (JP) .......................... 11-357741

(51) Int. Cl.[7] .............................. F28D 1/02; F28D 9/02; F25B 21/00; F25B 21/02; F28F 3/08
(52) U.S. Cl. ............................... 62/3.7; 62/3.2; 62/3.3; 165/164; 165/165; 165/166; 165/167; 165/170
(58) Field of Search ...................... 62/3.7, 3.2, 3.3; 165/164, 167, 170, 165, 166

(56) References Cited

U.S. PATENT DOCUMENTS

| 1,353,018 A | * | 9/1920 | Boeck .................... 165/170 |
| 1,795,774 A | * | 3/1931 | Hart |
| 2,566,310 A | * | 9/1951 | Burns et al. .............. 165/167 |
| 2,591,878 A | * | 4/1952 | Rogers et al. ............ 165/167 |
| 3,327,776 A | * | 6/1967 | Butt ...................... 165/170 |
| 4,249,597 A | * | 2/1981 | Carey .................... 165/166 |
| 4,258,785 A | * | 3/1981 | Beldam ................... 165/170 |
| 4,484,622 A | * | 11/1984 | Satchwell ................ 165/153 |
| 4,570,700 A | * | 2/1986 | Ohara et al. .............. 165/170 |
| 4,592,414 A | * | 6/1986 | Beasley .................. 165/153 |
| 4,700,774 A | * | 10/1987 | Schwarz .................. 165/170 |
| 5,143,241 A | | 9/1992 | Szymanski ................ 220/270 |
| 5,429,183 A | * | 7/1995 | Hisamori et al. .......... 165/167 |
| 5,564,276 A | * | 10/1996 | Abadilla et al. ........... 62/3.7 |
| 5,884,696 A | * | 3/1999 | Loup ..................... 165/167 |
| 5,987,893 A | | 11/1999 | Schulz-Harder et al. ...... 62/3.7 |

FOREIGN PATENT DOCUMENTS

| CA | 526493 | * | 6/1956 | ........ 165/164 |
| CA | 615322 | * | 2/1961 | ........ 165/170 |
| EP | 0 167 993 | | 1/1986 | |
| EP | 0 724 127 | | 7/1996 | |
| EP | 0 952 017 | | 10/1999 | |
| FR | 2702829 | * | 9/1994 | ........ 62/3.7 |
| GB | 424629 | * | 2/1935 | ........ 165/170 |
| GB | 1142092 | * | 2/1969 | ........ 165/164 |
| GB | 2 251 679 | | 7/1992 | |
| GB | 2 326 278 | | 12/1998 | |
| GB | 2 338 293 | | 12/1999 | |
| JP | 6-94386 | * | 4/1994 | ........ 165/170 |
| WO | WO 94/29656 | * | 12/1994 | ........ 62/3.7 |

* cited by examiner

Primary Examiner—John K. Ford
(74) Attorney, Agent, or Firm—Oblon, Spivak, McClelland, Maier & Neustadt, P.C.

(57) ABSTRACT

An object of the present invention is to provide a heat exchanger for a temperature control which can take a large area for transferring the heat to the fluid while it is compact, has a good efficiency for exchanging the heat, can increase and decrease the heat transferring area in conformity to the user's needs and the manufacturing cost thereof is low. The heat exchanging boards 2, 3 with a plate constitution and plural thermo modules are superposed alternately so that they have a laminate constitution. The heat exchanging board has a construction such that a flowing path defining board 5, in which a flowing path with a labyrinth construction is formed, is folded by a thin shell 7. The shell has an inflow hole into which the fluid flows and an outflow hole from which a fluid flows out passing through said flowing path with the labyrinth construction. A peltier element is used as the thermo module.

4 Claims, 6 Drawing Sheets

FIG. 10A
PRIOR ART
FIG. 10B
PRIOR ART
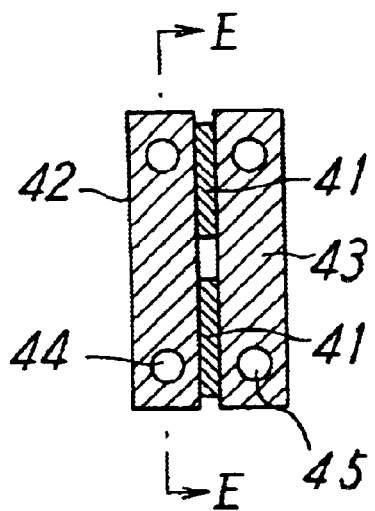
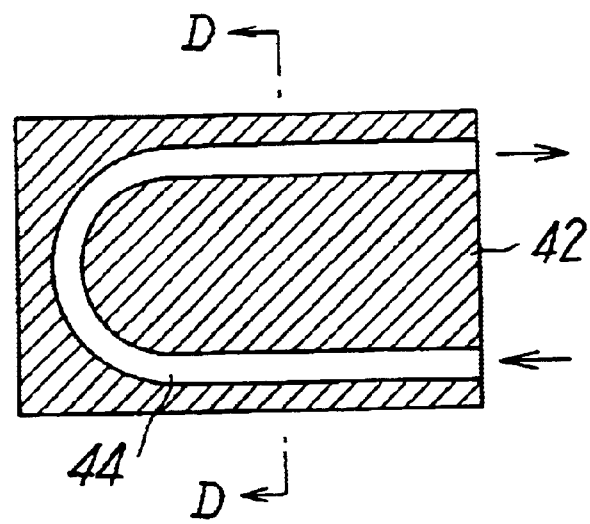

HEAT EXCHANGER FOR TEMPERATURE CONTROL

TECHNICAL FIELD

The present invention relates to a heat exchanger, which is utilized in a temperature control or the like for controlling temperature by cooling or heating a corrosive fluid (for example, a fluid such as a developing fluid and photo-resist or the like, which dislikes inflow of a metal ion), which flows through a flow path such as a pipe or if the like in a semiconductor related manufacturing apparatus or the like.

PRIOR ART

As an apparatus for controlling temperature of the corrosive fluid, FIG. 10 shows an apparatus, which puts a peltier element to use.

The temperature control shown in FIG. 10 contacts and fixes peltier element 41 on a surface of a heat exchanging block 42, which has a large heat capacity as a thermo module and exchanges the heat with the corrosive fluid flowing through a tube path 44. Further, the temperature control shown in FIG. 10 contacts and fixes a thermo transfer means 43 on the opposite side of the heat exchanging block 42 of the peltier element 41 to control the temperature of the above corrosive fluid to a target temperature by controlling the operation of the peltier element 41.

The above stated temperature control is provided with the heat exchanging block 42 on an endothermic side of the peltier element 41, i.e., a cooling surface side and is provided with the thermo transfer means 43 on a heat releasing side of the peltier element 41, i.e., a heating surface side, so that the corrosive fluid flowing through the tube path 44 is cooled by the peltier element 41 via the heat exchanging block 42. At the same time, the heat released from the corrosive fluid moves to the heat releasing side of the peltier element 41 and the heat of the corrosive fluid is transferred to the cooling water flowing through a tube path 45 within the thermo transfer means 43, so that the above stated temperature control can release the heat.

However, according to above stated conventional temperature control, coolness and heat from the peltier element 41 is transferred to the corrosive fluid flowing through the tube path 44 via the tube path 44 in the heat exchanging block 42. The heat released from the peltier element 41 is transferred to the cooling water flowing through the tube path 45 via the tube path 45 within the thermo transfer means 43. As a result, there is a problem such that both of the endothermic side and the heat releasing side of the peltier element 41 cannot take a large heat transferring area, so that an efficiency of the heat exchange is low.

Therefore, it is not possible to effectively utilize the difference between the temperature on the endothermic side and the temperature on the heat releasing side, which is given to the thermo module. Therefore, there is a problem such that the heat exchanger is compelled to be larger and the electric power cannot be effectively utilized.

In order to alternate the heat transferring area, it is necessary to change the design before and after the temperature control has been produced and it is difficult to increase and decrease the heat transferring area in conformity to the user's needs.

Further, since a conventional temperature control transfers the heat to the fluid flowing through the tube path via the tube path 44 in the heat exchanging block 42 and the tube path 45 within the thermo transfer means 43, there is a problem such that the manufacturing cost of the heat exchanger becomes higher.

DISCLOSURE OF THE INVENTION

The present invention has been made taking the problems into consideration, an object of which is to provide a heat exchanger for a temperature control, which can take a large area for transferring the heat to the fluid while it is compact, has a good efficiency for exchanging the heat, can increase and decrease the heat transferring area in conformity to the user's needs and the manufacturing cost thereof is low.

In order to attain the above object, the heat exchanger for the temperature control according to the present invention has a laminate constitution such that a heat exchanging board with a plate constitution and a heating board are superposed alternately, wherein the heat exchanging board has a construction such that a flowing path defining board, in which a flowing path with a labyrinth construction is formed, is formed by a folded thin shell; the flowing path defining board defines the flow path with the labyrinth construction by layering more than two thin sheets having many openings so that one opening of respective thin sheets, which are adjacent each other, can be overlapped in a part with two openings of other thin sheet, which are adjacent each other and the flowing path with the labyrinth construction is formed; and the shell has an inflow hole into which the fluid flows and an outflow hole from which a fluid flows out passing through the flowing path with the labyrinth construction.

According to the heat exchanger for the temperature control of the present invention, it is preferable that the shell of the heat exchanging board is defined such that the periphery of a thin metal sheet is sealed by curling the periphery of the sheet. Further, it is appropriate that two heat exchanging boards interposed the heating boards composed of thermo modules and one of the two heat exchanging boards is a heat exchanging board at an endothermic side and other is a heat exchanging board at a heat releasing side; the heat exchanging board at the endothermic side and the heat exchanging board at the heat releasing side have a multilayer constitution such that the hat exchanging board at the endothermic side and the heat exchanging board at the heat releasing side are alternately overlapped with interposing the thermo modules.

Further, according to the heat exchanger for the temperature control of the present invention, more than two of the heat exchanging boards at the endothermic side and more than two of the heat exchanging boards at the heat releasing side are provided, respectively; and the inflow hole and the outflow hole of the shell are connected to common headers, which are interposed by the heat exchanging boards, respectively, between the two heat exchanging boards at the endothermic side and the two heat exchanging boards at the heat releasing side. Alternatively, according to the heat exchanger for the temperature control of the present invention, more than three of the heat exchanging boards at the endothermic side and more than three of said heat exchanging boards at the heat releasing side are provided, respectively; the inflow hole and the outflow hole of the shell are connected to common headers, respectively, between the two heat exchanging boards at the endothermic side and the two heat exchanging boards at the heat releasing side; the headers are put between the heat exchanging boards to be fixed therebetween with being fitted into the inflow hole or the outflow hole of the heat exchanging boards in liquid tight; and the inflow hole or the outflow hole of the heat exchanging board, into which the headers are not fitted, is connected to connecting ductworks for connecting the inflow hole and the outflow hole such that a fluid can communicate through respective holes in liquid tight, between the two heat exchanging boards at the endothermic side or the two heat exchanging boards at the heat releasing side.

The heat exchanger for a temperature control according to the present invention is characterized in that two heat exchanging boards interpose the heating boards composed of thermo modules and one of the two heat exchanging boards is a heat exchanging board at an endothermic side and other is a heat exchanging board at a heat releasing side; the heat exchanging board at the endothermic side and the heat exchanging board at the heat releasing side have a multilayer constitution such that the heat exchanging board at the endothermic side and the heat exchanging board at the heat releasing side are alternately overlapped with interposing the thermo modules; and more than one heat exchanging board at the endothermic side and more than one heat exchanging board at the heat releasing side are provided.

The heat exchanger for a temperature control according to the present invention is characterized in that more than two of the heat exchanging boards at the endothermic side and more than two of the heat exchanging boards at the heat releasing side are provided, respectively; and the inflow hole and the outflow hole of the shell are connected to common headers, which are interposed by the heat exchanging boards, respectively, between the two heat exchanging boards at the endothermic side and the two heat exchanging boards at the heat releasing side.

According to the heat exchanger for the temperature control having above described constitution, the flowing path with a labyrinth construction is defined on the flowing path defining board by layering more than two thin sheets having many openings so that one opening of respective thin sheets, which are adjacent each other, can be overlapped in a part with two openings of other thin sheet, which are adjacent each other and the heat exchanging board is formed by folding that flowing path defining board with a thin shell. Therefore, when the fluid to flow through the flow path with a labyrinth construction of a heat exchanging board flows out to an inner surface side of the shell wall, the fluid comes in contact with a heat transferring surface of that shell wall to be mixed and distributed. As a result, the heat of the fluid can be efficiently and evenly transferred to the heat transferring surface of that shell wall and the heat transferring area is enlarged by the labyrinth construction, so that the transferring efficiency can be heightened to a large extent.

Further, according to the heat exchanger for the temperature control of the present invention, since the heat exchanging boards with a plate constitution and plural thermo modules are superposed alternately so that they have a laminate constitution. On this account, it is easy to change the number of the heat exchanging boards, so that it is also easy to increase and decrease the amount of heat transferring in conformity to the user's needs.

Alternatively, the flowing path defining board defines a flow path with a labyrinth construction by layering the thin sheet having many openings so that positions of openings of respective thin sheets, which are adjacent each other can be overlapped in a part. Therefore, it is possible to manufacture the path defining board having the flow path with the labyrinth construction easily and at a low price.

BRIEF DESCRIPTION OF DRAWINGS

FIGS. 10(A) and (B) show a conventional heat exchanger. Specifically, FIG. 10(A) shows a cross sectional view of FIG. 10(B) with being cut with a line of D—D and FIG. 10(B) shows a cross sectional view of FIG. 10(A) with being cut with a line of E—E.

DETAILED DESCRIPTION

Figure 1:
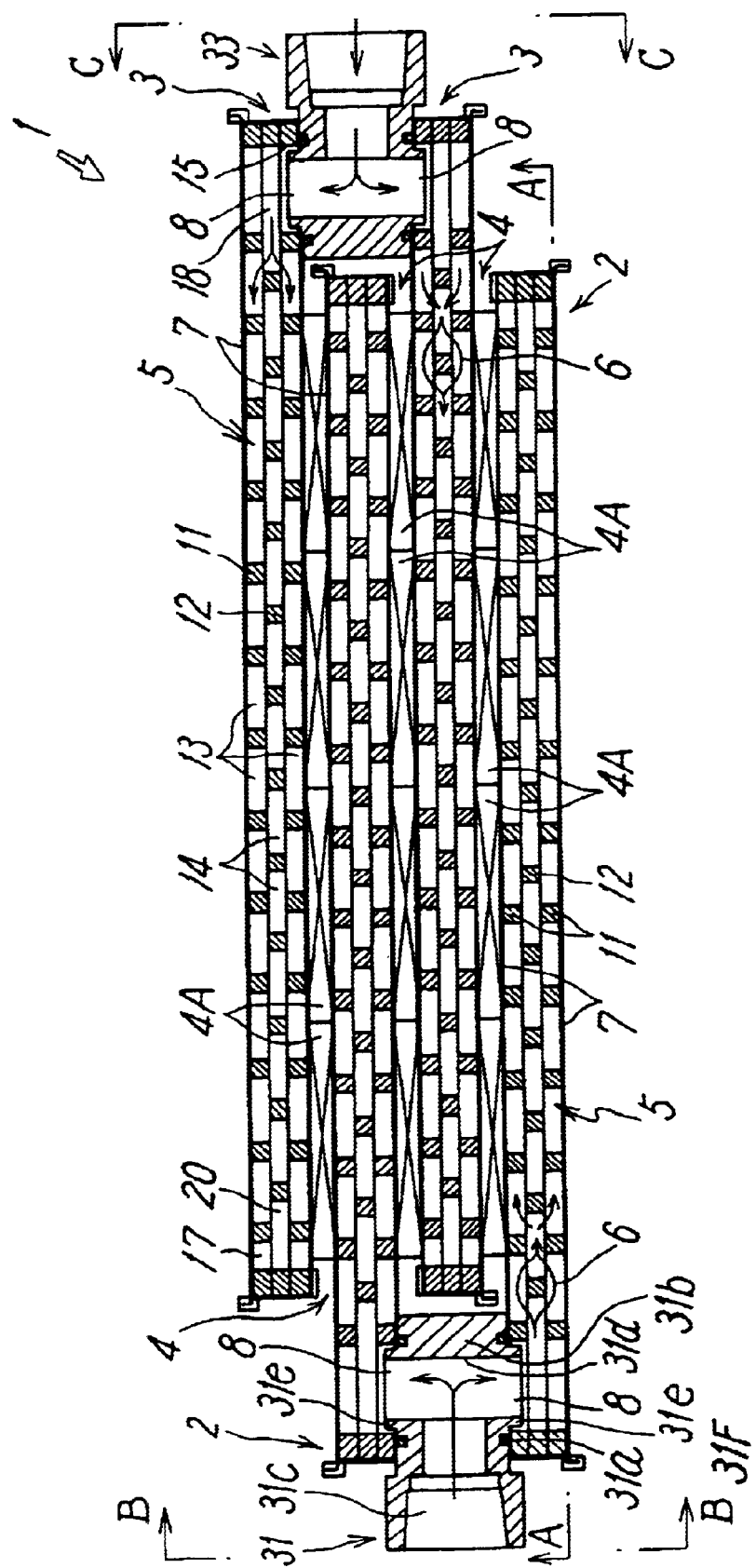
FIG. 1 shows a longitudinal sectional view illustrating an example of a heat exchanger for a temperature control according to the present invention.

FIG. 1 shows a longitudinal sectional view illustrating an example of a heat exchanger for a temperature control according to the present invention.

A heat exchanger for a temperature control 1 according to the present invention has a laminate constitution by alternately superposing heat exchanging boards or layers 2 and 3 with plate constitutions and heating boards or layers 4, which are composed of plural thermo modules 4A.

In other words, the heat exchanging boards 2 and 3 interpose the heating boards 4 composed of thermo modules 4A and one of them is a heat exchanging board 2 at an endothermic side and other is a heat exchanging board 3 at a heat releasing side. The heat exchanging board 2 at the endothermic side and the heat exchanging board 3 at the heat releasing side have identical constructions. The heat exchanging board 2 at the endothermic side and the heat exchanging board 3 at the heat releasing side are alternately overlapped with interposing the thermo modules 4A more than one piece, respectively, so that they have a multilayer constitution as shown in FIG. 1.

The heat exchanging boards 2 and 3 have a construction such that a flowing path defining board 5, in which an after-mentioned flowing path 6 with a labyrinth construction is formed, is covered by a folded shell 7 made of a thin metal sheet, the shell 7 being folded over the heat exchanging boards 2 and 3. Further, the shell 7 has an n outflow hole 9 (see FIG. 2). After passing through the flowing path in an inflow hole 8, into which the fluid flows, and the flowing path with the labyrinth construction, the fluid flows out from an outflow hole 9. The heating board 4 is not limited to being composed of the thermo modules and is capable of composed of arbitrary plate members for heating or cooling. Normally, a peltier element is used as the thermo module 4A.

By controlling the operation of the thermo module 4A, the temperature of the corrosive fluid flowing within the heat exchanging board 2 at the endothermic side is controlled to a target temperature and the heat from the corrosive fluid is transferred to the heat exchanging board 3 at the heat releasing side of heating surface side of the thermo module to be released to the cooling fluid flowing within the heat exchanging board 3 at the heat releasing side.

The examples shown in FIGS. 1 to 4 have two pieces of the heat exchanging board 2 at the endothermic side and the heat exchanging board 3 at the heat releasing side, respectively. The inflow hole 8 and the outflow hole 9 of the shell 7 are connected to common headers 31, 32, 33 and 34, respectively, between two heat exchanging boards 2 at the endothermic side and two heat exchanging boards 3 at the heat releasing side.

The headers 31 and 32, or the header 33 and 34 are fitted into the inflow hole or the outflow hole of the heat exchanging boards in liquid tight and they are fixed with being put between the two heat exchanging boards 2 at the endothermic side or the two heat exchanging boards 3 at the heat releasing side. Therefore, the two heat exchanging boards 2 at the endothermic side or the two heat exchanging boards 3 at the heat releasing side are coupled each other via the headers.

Since the headers 31, 32, 33 and 34 have identical construction, taking only the inflow header 31 to be attached to the heat exchanging board 2 at the endothermic side, a detail explanation will be given to this construction.

The inflow header 31 is provided with a pathway hole 31c and a penetrating hole 31d internally. The pathway hole 31c is formed by a tube peripheral wall 31a to flow the fluid in and out. The penetrating hole 31d is formed by the tubular wall 31b, which meets at right angles to the tube peripheral wall 31a. The penetrating hole 31d meets at right angles to the pathway hole 31c to communicate thereto. Further, opposite ends of the tubular wall 31b are provided with annular prominent portions 31e, respectively and the annular prominent portions 31e are fitted into the inflow holes 8 of the heat exchanging boards 2. On this account, the header 31 is fixed with being put between the two heat exchanging boards 2.

Alternatively, an annular concave portion 31f is provided on a periphery of the annular convex portion 31e and the annular concave portion 31f is filled with packing composing of an O ring, so that the heat exchanging board 2 at the endothermic side and the inflow header 31 in liquid tight.

Figure 2:
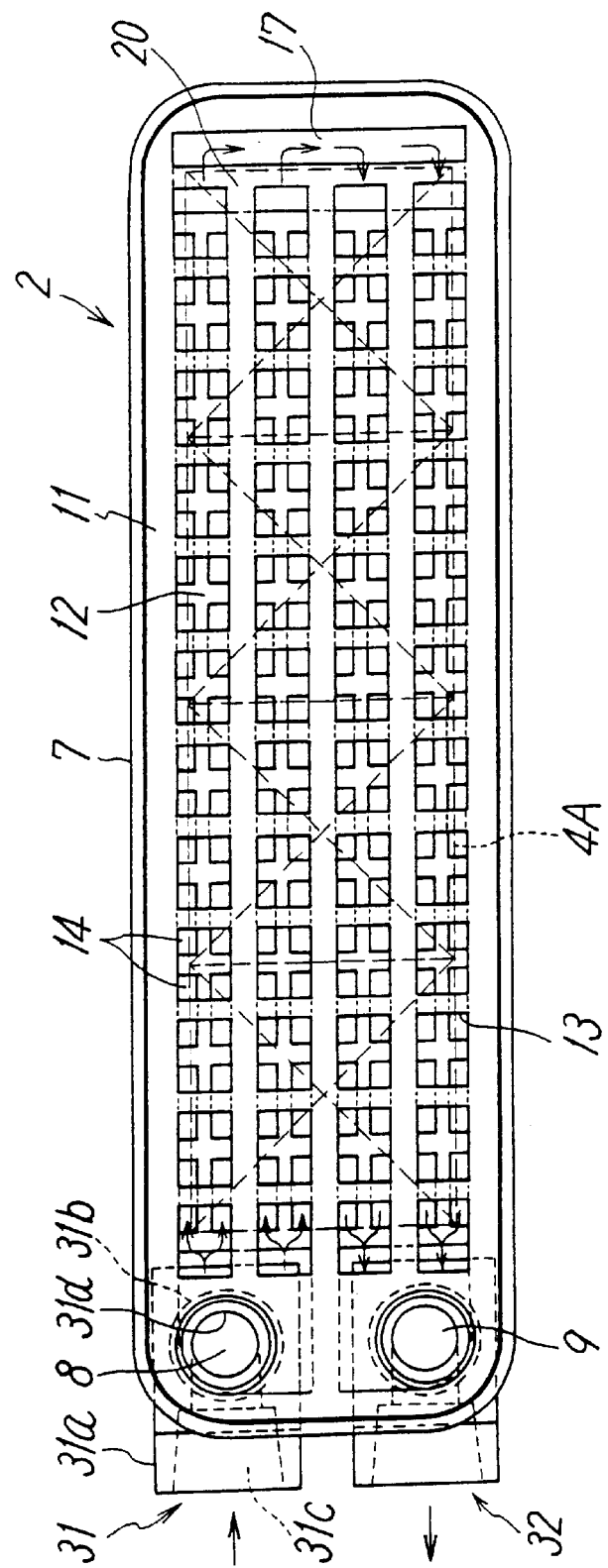
FIG. 2 shows a cross sectional view of FIG. 1 with being cut with a line of A—A.

FIG. 2 shows a cross sectional view of FIG. 1 with being cut with a line of A—A. As shown by the arrow, the fluid, which has been flowed into the heat exchanging board 2 through the inflow hole 8 from the header 31, flows through the flowing path with the labyrinth construction in a right direction in FIG. 2 and turns around at the portions of openings 17 and 20 at a right end of the heat exchanging board 2 to return in a left direction. Then, the fluid passes through the outflow hole 9 and flows out from the header 32.

Figure 3:
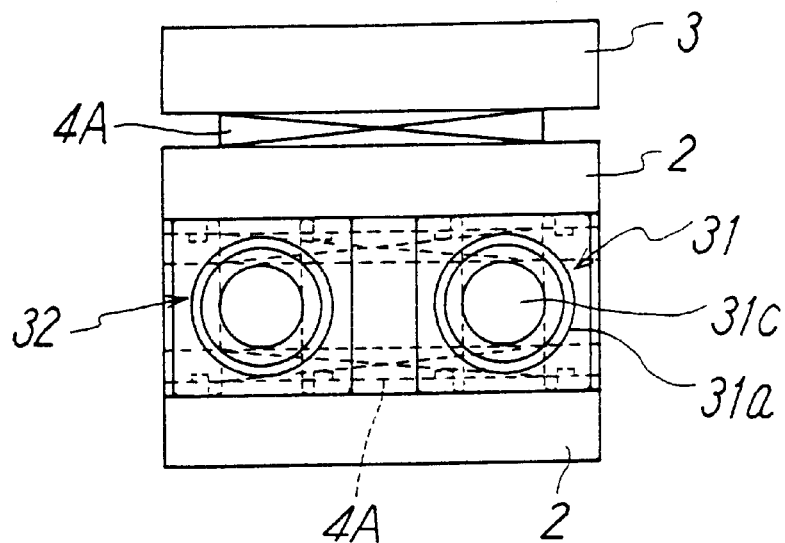
FIG. 3 shows a view of FIG. 1 from the viewing point illustrated by an arrow B—B.
Figure 4:
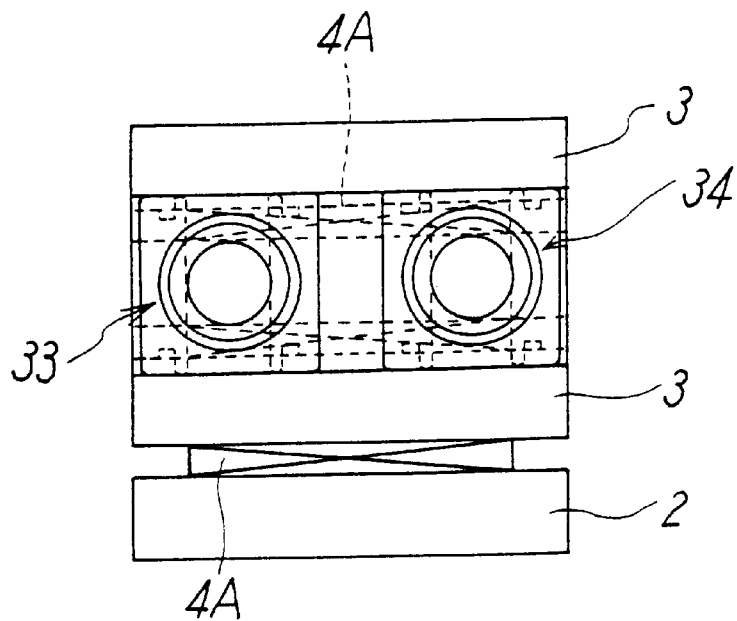
FIG. 4 shows a view of FIG. 1 from the viewing point illustrated by an arrow C—C.

FIG. 3 shows a view of FIG. 1 from the viewing point illustrated by an arrow B—B and FIG. 4 shows a view of FIG. 1 from the viewing point illustrated by an arrow C—C. FIG. 3 shows the header 31 at the inflow side and the header 32 at the outflow side, which are put between the two heat exchanging boards 2 at the endothermic side. FIG. 4 shows the header 33 at the inflow side and the header 34 at the outflow side, which are put between the two heat exchanging boards 3 at the heat releasing side.

Figure 5:
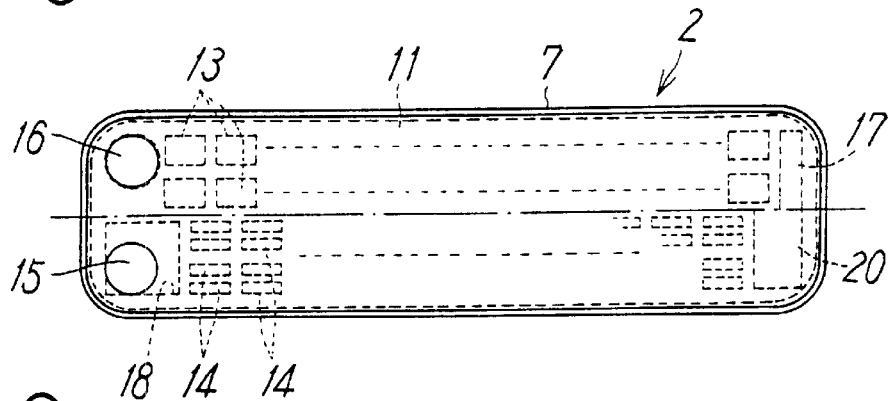
FIG. 5 shows a plane view of a heat exchanging board, which is used for the heat exchanger according to the present invention.

FIG. 5 shows a plane view of the heat exchanging board 2. An upper half portion from a central line thereof is a perspective view of a thin sheet 11 (FIG. 7) comprising the flowing path defining board 5 and a lower half portion from the central line thereof is a perspective view of another thin sheet 12 (FIG. 8) comprising the flowing path defining board 5.

Figure 6:
FIG. 6 shows a front sectional view of FIG. 5.

FIG. 6 shows a front sectional view of FIG. 5. The thin sheets 11 and 12 are alternately overlapped to have a laminate constitution with three layers. The layered thin sheets 11, 12 and 11 compose the flowing path defining board 5.

Figure 7:
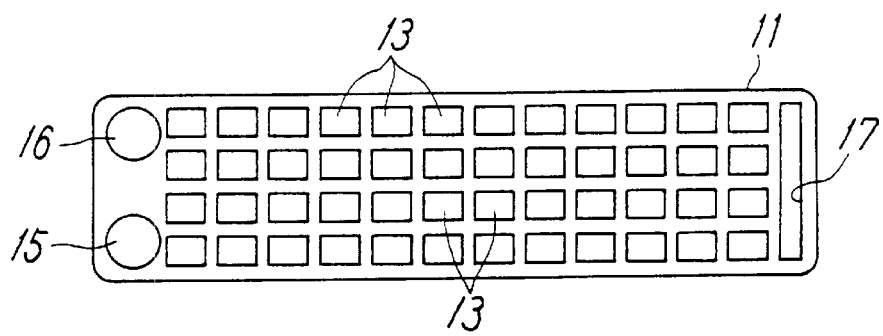
FIG. 7 shows a plane view for illustrating a specific construction of a thin sheet 11, which defines a flow path defining board.
Figure 8:
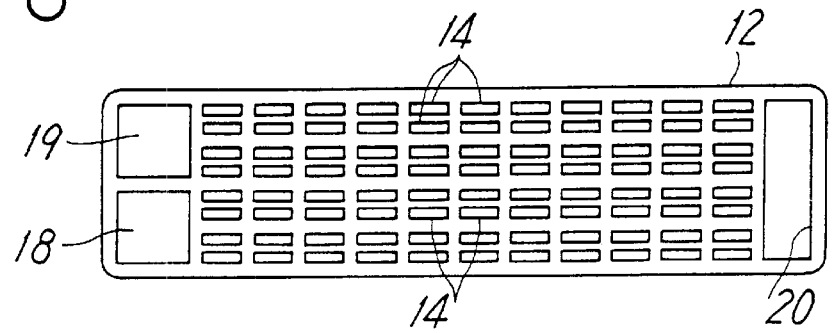
FIG. 8 shows a plane view for illustrating a specific construction of another thin sheet 12, which defines a flow path defining board.

FIGS. 7 and 8 illustrate specific constructions of the thin sheet 11 and the thin sheet 12 configuring the flowing path defining board with the labyrinth construction. These thin sheets 11 and 12 configuring the flowing path defining board have many openings 13 and 14 in a long direction and in a width direction. Further, they have an opening 17 and an opening 20, which elongate in a width direction, respectively, at right end sides of FIGS. 7 and 8. They have inflow openings 15, 18 and outflow openings 16, 19, which are connected to the inflow hole 8 and the inflow hole 9 of the shell 7, respectively, at left end sides of FIGS. 7 and 8. It is preferable that the openings 13 of the thin sheet 11 in contact with an inner surface of the shell 7 is larger than the opening 14 to enlarge a contacting area between the inner surface of the shell 7 and the fluid. However, as understood from FIG. 1, at least more than two thin sheets 11 and 12 having many openings are layered so that one openings in each of thin sheets 11 and 12 which are adjacent each other is overlapped with two openings of an adjoining other thin sheet in a part.

Therefore, if the flowing path defining board 5 composing of these thin sheets 11 and 12 is folded by the thin shell 7 to configure the heat exchanging board, then, the fluid always crushes into the heat transfer surface of the shell wall to be mixed and disturbed when the fluid flowing through the flowing path with the labyrinth construction flows out to the inner surface side of the shell wall. As a result, the heat is capable of being effectively and evenly transferred between the fluid and electric field surface of the shell wall to heighten the heat transfer efficiency to a large extent.

Alternatively, the length of the openings 17 and 20 in the thin sheets 11 and 12 is enough to cover all area of many openings 13 and 14, which bare defined in the width direction. Further, the opening 20 is configured so as to communicate the opening 17 and the opening 13. Therefore, the opening 17 and the opening 20 can configure a turning around flowing path for the fluid.

As a method for sealing up the shell 7 of the heat exchanging board, welding of a metal sheet or brazing may be considered. However, it is preferable that the shell 7 is sealed by curling an edge of the shell 7, which is a sealing method of a hem of a can.

If the shell 7 of the heat exchanging board is sealed by the curling process, it becomes possible to lower the cost for manufacturing the heat exchanging board.

Further, as a material of the shell 7, a stainless steel may be employed and as materials of the thin sheets 11 and 12 composing the flowing path defining board, not only a stainless steel but also plastic such as polyethylene and polypropylene or the like may be employed. However, materials for the shell 7 and the thin sheets 11 and 12 are not limited to these materials.

The heat exchanging board 2 is folded by the thin shell 7. In this arrangement, even thin sheet is capable of bearing with a fluid pressure, since it is pushed down to the flowing path defining board by heating boards upon combining heating boards composing of the thermo modules. In this case, the shell is thin, so that it has a small heat resistance.

Further, according to the flowing path defining board 5, the thin sheets 11 and 12 are layered so that the positions of the openings of respective thin sheets, which are adjacent each other, are overlapped each other in a part and are formed the flowing path with the labyrinth construction. Therefore, the fluid flowing through the flowing path crushes into the heat transfer surface of the shell wall to be mixed and disturbed. Mixing and disturbing of the fluid allows a heat exchanging board with a simple configuration for efficiently exchanging the heat to be obtained.

Figure 9:
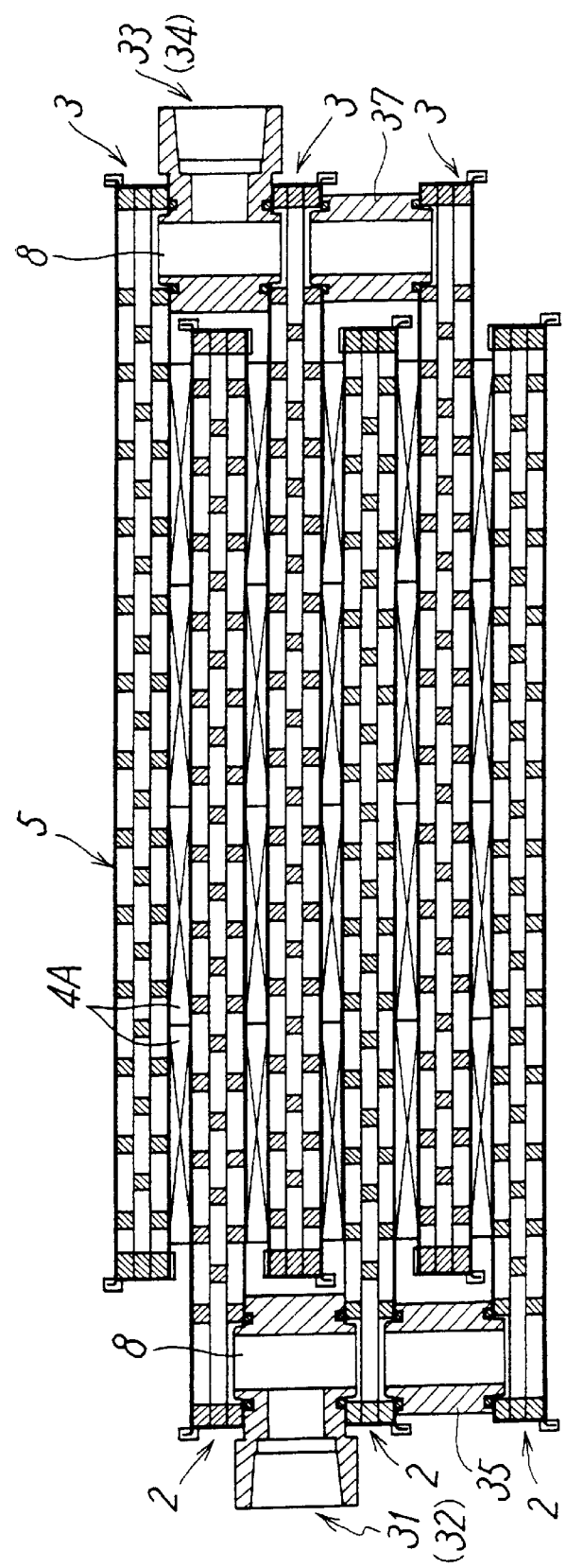
FIG. 9 shows a longitudinal sectional view illustrating another example of a heat exchanger for a temperature control according to the present invention.

FIG. 9 shows a longitudinal sectional view illustrating another example of a heat exchanger for a temperature control according to the present invention. According to this example, leaving that there are three pieces of the heat exchanging boards 2 at the endothermic side and the heat exchanging boards 3 at the heat releasing side, respectively, basically, this present example has an identical constitution as that of the example shown in FIG. 1.

Accordingly, in FIG. 9, the same reference numerals are given to the same constitutional elements as those shown in FIG. 1.

In the example shown in FIG. 9, three heat exchanging boards 2 at the endothermic side and three heat exchanging board 3 at the heat releasing side are provided, respectively. However, even when the number of the heat exchanging boards increases, it is not necessary to increase the number of the headers in response thereto.

In other words, one header 31 at the inflow side and one header 32 at the outflow side, which are put between the two heat exchanging boards 2 at the endothermic side, are provided, respectively and the inflow hole 8 and the outflow hole 9 of the three heat exchanging boards 2 at the endothermic side are connected to the common header 31 at the inflow side and the common header 32 at the outflow side, respectively.

In the same way, one header 33 at the inflow side and one header 34 at the outflow side, which are put between the two heat exchanging boards 3 at the heat releasing side, are provided and the inflow hole 8 and the outflow hole 9 of the three heat exchanging boards 3 at the heat releasing side are connected to the common header 33 at the inflow side and the common header 34 at the outflow side, respectively.

The header 31, 32 and the header 33, 34 are fitted into the inflow hole 8 or the outflow hole 9 of the heat exchanging board in liquid tight in the same manner as the examples shown in FIGS. 1 to 4. At the same time, they are fixed with being put between the two heat exchanging boards 2 at the endothermic side or the two heat exchanging boards 3 at the heat releasing side. However, the inflow hole 8 or the outflow hole 9 of the heat exchanging board, into which the headers are not fitted, is connected to connecting ductworks 35 and 37 for connecting the inflow hole 8 and the outflow hole 9 such that the fluid can communicate through respective holes in liquid tight, between the two heat exchanging boards 2 at the endothermic side or the two heat exchanging boards 3 at the heat releasing side. As a result, the heat exchanging boards 2 at the endothermic side or the two heat exchanging boards 3 at the heat releasing side are coupled each other via the connecting ductworks. The outflow hole 9 (not illustrated) also employs the connecting ductworks having the same construction as the case of the inflow hole 8.

The opposite end portions of the connecting ductworks 35 and 37 have stepped peripheral walls. Packing comprising an O ring is filled in those steps, so that the heat exchanging boards 2 at the endothermic side and the connecting ductworks are attached in liquid tight.

According to the example shown in FIG. 9, three heat exchanging boards 2 at the endothermic side and three heat exchanging boards 3 at the heat releasing side are provided, respectively. However, more than four heat exchanging boards 2 at the endothermic side and more than four heat exchanging boards 3 at the heat releasing side are provided, respectively, may be simply capacitated only by increasing the number of the connecting ductworks.

Further, in the example shown in FIG. 9, the exchanging boards 2 at the endothermic side and the heat exchanging boards 3 at the heat releasing side are coupled each other via the headers and the connecting ductworks. Therefore, is possible to obtain one heat exchanger for a temperature control as a whole, so that it is also possible to increase the heat transferring area simply and at a low cost.

As described in detail, according to the heat exchanger for the temperature control of the present invention, the heat exchanging board has a construction such that a flowing path defining board, in which the flowing path with the labyrinth construction is formed, is folded by the thin shell. As a result, the heat resistance of the shell is small and the fluid to flow through the flowing path with the labyrinth construction in the heat exchanging board crashes into the heat transferring surface of the shell wall to be mixed and disturbed, so that the efficiency of the heat transferring is capable of being heightened to a large extent.

Further, according to the heat exchanger for the temperature control of the present invention, since the heat exchanging board with a plate constitution and the heating board composed of plural thermo modules are superposed alternately so that they have a laminate constitution. On this account, it is easy to change the number of the heat exchanging boards, so that it is also easy to increase and decrease the amount of heat transferring in conformity to the user's needs. Alternatively, the flowing path defining board defines a flow path with a labyrinth construction by layering the plural thin sheets so that positions of openings of respective thin sheets, which are adjacent each other can be overlapped in a part. Therefore, it is possible to manufacture the flowing path defining board having the flowing path with the labyrinth construction easily and at a low price.

Further, since the heat exchanging board to be used for the heat exchanger for the temperature control of the present invention has the heat exchanging board at the endothermic side and the heat exchanging board at the heat releasing side having the same constructions, it is possible to lower the manufacturing cost for the heat exchanging board. Alternatively, since more than two heat exchanging board at the endothermic side and more than two heat exchanging board at the heat releasing side are capable of being connected to common headers, respectively, it is possible to supply the fluid to the heat exchanging board with a simple construction such that two heat exchanging boards are connected only be the header and to lower the manufacturing cost for the heat exchanger for the temperature control.

What is claimed is:

1. A heat exchanger for a temperature control comprising:
    a laminate constitution including first and second heat exchanging boards each with a plate constitution and a heating board superposed alternately in a height direction, wherein said first heat exchanging board has a construction such that a flowing path defining board, in which a flowing path with a labyrinth construction is formed, is covered by a folded thin shell; said flowing path defining board defines said flow path with the labyrinth construction by layering more than two thin sheets having many openings so that one opening of respective thin sheets, which are adjacent each other, can be overlapped in a part with two openings of other thin sheet, which are adjacent each other and form said flowing path with the labyrinth construction; and said shell has an inflow hole into which the fluid flows and an outflow hole from which a fluid flows out passing through said flowing path with the labyrinth construction, the first heat exchanging board having a first end protruding past the second heat exchanging board in a length direction that is perpendicular to the height direction, and the second heat exchanging board having a second end protruding past the first heat exchanging board in the length direction, the first heat exchanging board having a first inflow header and a first outflow header disposed adjacent each other on the first side, and the second heat exchanging board having a second inflow header and a second outflow header disposed adjacent each other on the second side, the first inflow and outflow headers each including an opening that extends along the length direction and intersects with a first pathway extending along the height direction to move fluid through the first heat exchanging board, and the second inflow and outflow headers each including an opening that extends along the length direction and intersects with a second pathway extending along the height direction to move fluid through the second heat exchanging board, wherein said shell is defined such that a periphery of a thin metal sheet is sealed by curling an edge of the sheet.

2. A heat exchanger for a temperature control according to claim 1, wherein the first and second heat exchanging boards interpose said heating board composed of thermo modules and said first heat exchanging board is a heat exchanging board at an endothermic side and the second heat exchanging board is at a heat releasing side; said first heat exchanging board and said second heat exchanging board each having a multilayer constitution such that said first heat exchanging board and said second heat exchanging board are alternately overlapped with said thermo modules; and more than one heat exchanging board at the endothermic side and more than one heat exchanging board at the heat releasing side are provided.

3. A heat exchanger for a temperature control according to claim 2, wherein more than two of said heat exchanging boards at the endothermic side and more than two of said heat exchanging boards at the heat releasing side are provided, respectively; and said inflow hole and said outflow hole of said shell are connected to the first inflow and outflow headers, respectively, which are interposed by said heat exchanging boards, respectively, between said two heat exchanging boards at the endothermic side and said two heat exchanging boards at the heat releasing side.

4. A heat exchanger for a temperature control according to claim 2, wherein more than three of said heat exchanging boards at the endothermic side and more than three of said heat exchanging boards at the heat releasing side are provided, respectively; said inflow hole and said outflow hole of said shell are connected to the first inflow and outflow headers, respectively, between said two heat exchanging boards at the endothermic side and said two heat exchanging boards at the heat releasing side; said first inflow and outflow headers are put between said heat exchanging boards to be fixed therebetween with being fitted into said inflow hole or said outflow hole of said heat exchanging boards in liquid by tight relationship; and said inflow hole or said outflow hole of said heat exchanging board, into which said headers are not fitted, is connected to connecting ductworks for connecting said inflow hole and, said outflow hole such that a fluid can communicate through respective holes in liquid tight relationship, between said two heat exchanging boards at the endothermic side or said two heat exchanging boards at the heat releasing side.

* * * * *